United States Patent [19]

Imura et al.

[11] Patent Number: 5,539,245
[45] Date of Patent: Jul. 23, 1996

[54] SEMICONDUCTOR SUBSTRATE HAVING A GETTERING LAYER

[75] Inventors: Makoto Imura, Tokyo-to; Kenji Kusakabe, Hyogo-ken, both of Japan

[73] Assignees: Mitsubishi Materials Silicon Corporation; Mitsubishi Materials Corporation; Mitsubishi Denki Kabushiki Kaisha, all of Tokyo, Japan

[21] Appl. No.: 248,916

[22] Filed: May 25, 1994

Related U.S. Application Data

[62] Division of Ser. No. 953,345, Sep. 30, 1992, Pat. No. 5,327,007.

[30] Foreign Application Priority Data

Nov. 18, 1991 [JP] Japan ..................... 3-301440

[51] Int. Cl.⁶ ..................... H01L 21/322; H01L 21/38
[52] U.S. Cl. ..................... 257/610; 257/166; 257/913; 437/10; 437/12
[58] Field of Search ..................... 257/120, 131, 257/156, 610, 611, 617, 913, 924; 437/10–13

[56] References Cited

U.S. PATENT DOCUMENTS

| | | | |
|---|---|---|---|
| 4,575,466 | 3/1986 | Iwai et al. | 437/156 |
| 4,649,408 | 3/1987 | Sekine et al. | 287/229 |
| 4,885,257 | 12/1989 | Matsushita | 437/11 |
| 5,194,395 | 3/1993 | Wada | 437/10 |
| 5,220,191 | 6/1993 | Matsushita | 257/368 |

FOREIGN PATENT DOCUMENTS

| | | | |
|---|---|---|---|
| 0056462 | 4/1983 | Japan | 437/12 |
| 0207642 | 12/1983 | Japan | 437/10 |
| 0082717 | 5/1984 | Japan | 437/10 |
| 0136218 | 7/1985 | Japan . | |
| 0182216 | 8/1986 | Japan . | |
| 0182215 | 8/1986 | Japan . | |
| 0235741 | 10/1987 | Japan | 437/10 |
| 0227026 | 9/1988 | Japan | 437/12 |
| 0246831 | 10/1988 | Japan . | |
| 0046770 | 2/1990 | Japan . | |
| 0184345 | 8/1991 | Japan | 437/12 |

OTHER PUBLICATIONS

Translations of Japan Kokai Publications #03–184345 (Aug. 1991), #62–235741 (Oct. 1987) & #59–082717 (May 1984).

*Primary Examiner*—Peter Toby Brown
*Attorney, Agent, or Firm*—Lowe, Price, LeBlanc & Becker

[57] ABSTRACT

A silicon wafer having a low concentration of carbon and a silicon wafer having a high concentration of carbon are joined and polished to prescribed thicknesses to form a semiconductor substrate according to the present invention.

2 Claims, 4 Drawing Sheets

SEMICONDUCTOR SUBSTRATE HAVING A GETTERING LAYER

This application is a division of application Ser. No. 07/953,345 filed Sep. 30, 1992 now U.S. Pat. No. 5,327,007.

BACKGROUND OF THE INVENTION

1. Field of the Invention

The present invention relates to a structure of a semiconductor substrate producing an excellent gettering effect.

2. Description of the Background Art

In a manufacturing process of a semiconductor device, alkaline metal such as Na or heavy metal impurities such as Fe are brought into a semiconductor device from a contamination source such as a manufacturing apparatus, chemicals and atmosphere. These metal impurities have harmful influence, such as change of characteristics of the semiconductor device and an increase in junction leakage current. Therefore, a process to remove such metal impurities from inside a semiconductor device is carried out. The process is called gettering. Two such gettering processes are known, one being extrinsic gettering in which impurities are normally segregated through heat-treatment at high temperatures on a back surface of a semiconductor substrate which is not an active region of an element, and the other being intrinsic gettering in which a place for segregating harmful impurities is provided using supersaturated oxygen included in a silicon substrate. A conventional intrinsic gettering method will be described.

FIG. 11 is a sectional structural view of a silicon wafer which has undergone a gettering process. A denuded zone (hereinafter referred to as a DZ layer) having neither oxygen precipitates nor lattice defects is formed on a surface region of a silicon wafer 1 and an IG layer 4 producing a gettering effect is formed within a silicon wafer 1. Since lattice defects or the like do not exist in DZ layer 3, a variety of semiconductor elements are formed in this layer. IG layer 4 is a region where many oxygen precipitates 6 exist. Metal impurities brought into the surface of silicon wafer 1 are segregated around the oxygen precipitates 6 of the IG layer 4, so that DZ layer 3 in the surface of silicon wafer 1 is protected from contamination of impurities.

An intrinsic gettering method will be described. FIGS. 12 through 15 are diagrams showing steps of the gettering method for silicon wafer 1 shown in FIG. 11.

First, referring to FIG. 12, a silicon wafer 1a is prepared. Silicon wafer 1a manufactured by, for example, a Czochralski method (hereinafter referred to as a CZ method) has a concentration of oxygen of $14-18\times10^{17}$ atoms/cm$^3$.

Next, as shown in FIG. 13, silicon wafer 1a undergoes heat treatment at high temperatures of 1000°–1250° C., and oxygen 2 included in silicon wafer 1a is diffused outward. Through this step, DZ layer 3 of a low concentration of oxygen is formed in a surface of silicon wafer 1a. A region 4a of which concentration of oxygen is uniform remains inside silicon wafer 1a.

Thereafter, as shown in FIG. 14, heat treatment at low temperatures of 500°–800° C. is carried out and oxygen precipitation nuclei 5 grow in region 4a.

Referring to FIG. 15, in heat treatment at intermediate temperatures of 800°–1100° C., oxygen precipitating nuclei 5 are grown to be oxygen precipitates 6. The region where oxygen precipitates 6 are formed is IG layer 4 producing a gettering effect.

After three stages of heat treatment are carried out, silicon wafer 1a is placed into a manufacturing process of a device. Heat treatment to be carried out in the manufacturing process of a device may be replaced with the heat treatment step at intermediate temperature shown in FIG. 15. However, if the heat treatment in the manufacturing process of a device is short and insufficient, the above described heat treatment at intermediate temperature is carried out prior to the manufacturing process of a device.

Generally, DZ layer 3 where semiconductor elements are formed should have a thickness d of at least about 50μm. As described above, a thickness of DZ layer 3 in a silicon wafer 1a manufactured by a conventional IG method is defined in heat treatment at high temperature shown in FIG. 13. In order to increase a thickness d of DZ layer 3, time for heat treatment at high temperature should be longer. If the time for heat treatment at high temperature is set longer, more oxygen 2 is diffused outward from silicon wafer 1a, and as a result, thickness d of DZ layer 3 having a low concentration of oxygen becomes larger. In the heat treatment step at high temperature, oxygen nuclei of IG layer 4 are restrained from growing and does not become larger, so that, in order to grow oxygen nuclei in the IG layer for providing more effective gettering, a time for heat treatment at low temperature shown in FIG. 14 should be set long. If the heat treatment at high temperature or low temperature for such a long time is carried out, non-uniform temperature distribution is caused, resulting in warping of wafer or slip dislocation within the wafer. The heat treatment step for such a long time lowers a throughput of wafer, which is a factor preventing mass production.

FIG. 16 is a diagram showing the distribution of oxygen concentration of the silicon wafer. Referring to the figure, the distribution of oxygen concentration is plotted as a gentle curve from DZ layer 3 to IG layer 4. In a horizontal direction with respect to the surface of wafer 1, oxygen precipitates 6 sparsely exists in a boundary of DZ layer 3 and IG layer 4, as shown in FIG. 11. As a result, necessary thickness d of DZ layer 3 is not uniform, oxygen precipitates 6 are formed in DZ layer 3, and therefore a problem arises that a yield of wafer is decreased.

SUMMARY OF THE INVENTION

One object of the present invention is to provide a semiconductor substrate having a semiconductor element forming layer of uniform thickness and a layer producing a gettering effect.

Another object of the present invention is to optimize a concentration of oxygen of a semiconductor substrate having a semiconductor element forming layer and a gettering layer.

In a semiconductor substrate according to a first aspect of the present invention, a first single crystalline silicon layer and second single crystalline silicon layer are joined. The first single crystalline silicon layer has a main surface where semiconductor elements are formed and a junction surface facing to the main surface. The layer uniformly has a first concentration of oxygen along a direction vertical to the main surface. The second single crystalline silicon layer joined to the junction surface of the first single crystalline silicon layer uniformly has a second concentration of oxygen which is higher than the first concentration of oxygen along a direction vertical to the main surface.

In the semiconductor substrate, a first single crystalline silicon substrate having a prescribed low concentration of oxygen and a second single crystalline silicon substrate having a prescribed high concentration of oxygen are joined, so that a DZ layer of the first single crystalline silicon substrate can have an arbitrary and uniform thickness. Also, density of oxygen precipitates in the second single crystalline silicon layer can be set arbitrarily independent of that in the first single crystalline silicon layer.

A semiconductor substrate according to a second aspect of the present invention has a first single crystalline silicon layer and a second single crystalline silicon layer joined to a junction surface of the first single crystalline silicon layer. The first single crystalline silicon layer has a main surface where a semiconductor device is formed and a junction surface facing to the main surface, and has a first concentration of carbon uniformly along the direction vertical to the main surface. The second single crystalline silicon layer has a second concentration of carbon which is higher than the first concentration of carbon in the first single crystalline silicon layer.

In the semiconductor substrate, a wafer having a carbon concentration of, for example, less than $1 \times 10^{15}$ atoms/cm$^3$ is used for a DZ layer, and a wafer having a carbon concentration, for example, $1 \times 10^{15}$ atoms/cm$^3$ or more is used for an IG layer, so that, in the IG layer, carbon can act as oxygen precipitating nuclei and promote precipitation of oxygen and in the DZ layer, a carbon concentration is set low to avoid influence of carbon on the layer.

A semiconductor substrate according to a third aspect of the present invention includes a first single crystalline silicon layer having a main surface where a semiconductor element is formed and uniformly having a first concentration of oxygen along the direction vertical to the main surface, and a second single crystalline silicon layer uniformly having a second concentration of oxygen, which is higher than the first concentration of oxygen in the first single crystalline silicon layer, along the direction vertical to the main surface. Between the first single crystalline silicon layer and the second single crystalline silicon layer, an intermediate layer is formed to prevent move of oxygen atoms from the second single crystalline silicon layer to the first single crystalline silicon layer.

In the semiconductor substrate, an intermediate layer is interposed between the first single crystalline silicon layer and a second single crystalline silicon layer. The intermediate layer prevents oxygen from diffusing into the first single crystalline silicon layer from the second single crystalline silicon layer. The layer helps to maintain a low concentration of oxygen in the first single crystalline silicon layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
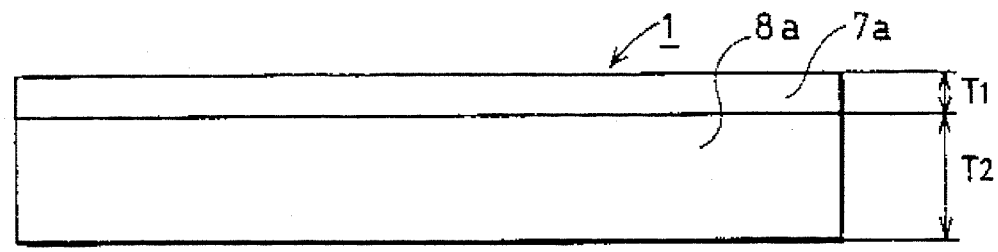
FIG. 1 is a sectional structural view of a semiconductor substrate 1 according to a first embodiment of the present invention.
Figure 16:
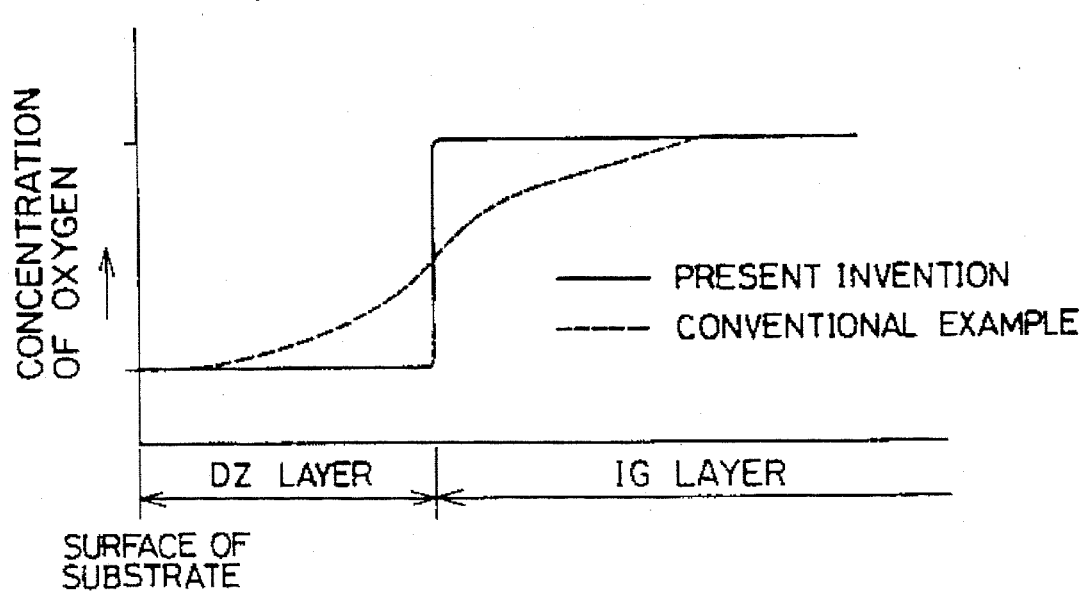
FIG. 16 is a diagram showing distribution of oxygen concentration along a direction vertical to the surface of a semiconductor substrate.

Referring to FIG. 1, a silicon wafer 1 according to a first embodiment of the present invention is comprised of stacked layers of a DZ layer 7a having a thickness $T_1$ of about 100 µm and an oxygen concentration of $2-3\times10^{17}$ atoms/cm$^3$, and an IG layer 8a having a thickness $T_2$ of about 430µm and an oxygen concentration of $16-17\times10^{17}$ atoms/cm$^3$. DZ layer 7a does not include lattice defects or oxygen precipitates and has a uniform thickness in the surface of the wafer. As shown in FIG. 16, oxygen concentrations are distributed uniformly along the direction vertical to the surface of the substrate in DZ layer 7a and IG layer 8a, respectively. The distribution sharply changes near the boundary of DZ layer 7a and IG layer 8a.

A manufacturing method of silicon wafer 1 shown in FIG. 1 will be described.

Figure 2:
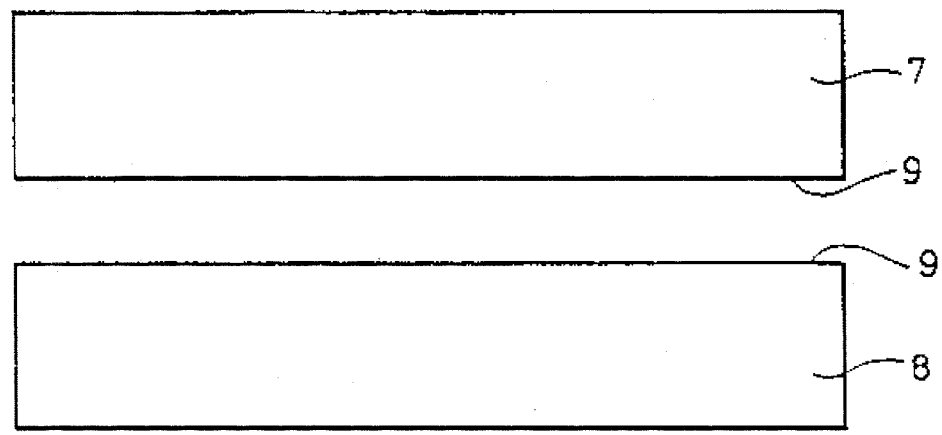
FIGS. 2 through 4 are sectional structural views successively showing respective manufacturing steps of the semiconductor substrate shown in FIG. 1.

Referring to FIG. 2, two single crystalline silicon wafers 7, 8 are prepared. A first single crystalline silicon wafer 7 is formed by an MCZ (Magnetic Field Applied Czochralski) method, and has an orientation (100) and an oxygen concentration of $2-3\times10^{17}$ atoms/cm$^3$. A second single crystalline silicon wafer 8 is formed by a CZ (Czochralski) method and has an orientation (100) and an oxygen concentration of $16-18\times10^{17}$ atoms/cm$^3$. Junction surfaces 9, 9 of first single crystalline silicon wafer 7 and second single crystalline silicon wafer 8 are mirror-polished using a mechanochemical polishing method. In a mechanochemical polishing method, wafers are polished at a certain temperature and pressure, using a colloidal silica solution of pH9–12 containing fine-grained SiO$_2$ of 100–500 Å as a main component for abrasive and artificial leather of nonwoven fabric impregnated with polyurethane for abrasive cloth. After mirror-polishing, the surfaces of the wafers are cleaned to remove particles and then undergo hydrophilic processing. Mixed liquid of $NH_4OH+H_2O_2+H_2O$ is used for the cleaning. The wafers which have been mirror-polished are dipped into the mixed liquid to remove particles and then dried. $H_2O_2$ contained in the mixed liquid makes the surfaces of the wafers hydrophilic, so that —OH adheres to the surfaces of the wafers.

Figure 3:
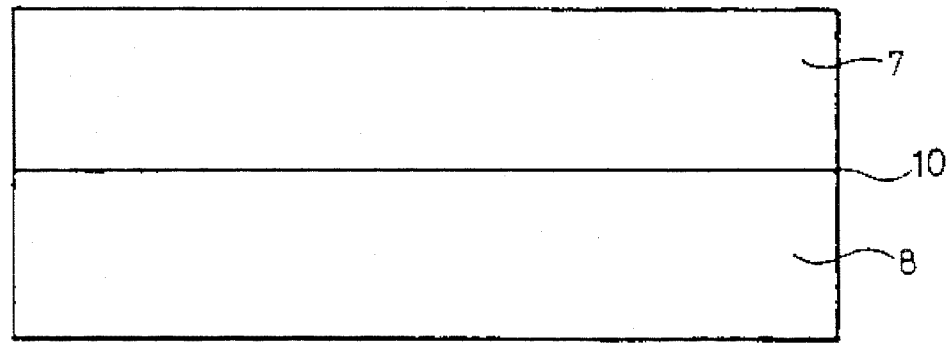

Referring to FIG. 3, first single crystalline silicon wafer 7 and second single crystalline silicon wafer 8 which have undergone hydrophilic processing are arranged such that junction surfaces 9, 9 thereof are joined with crystal axes of one junction surface being lined up with those of the other junction surface. Two single crystalline silicon wafers 7, 8 are heat-treated at a high temperature of about, for example, 1100° C. and oxygen in junction interface 10 of both wafers is diffused, so that they are joined.

Figure 4:
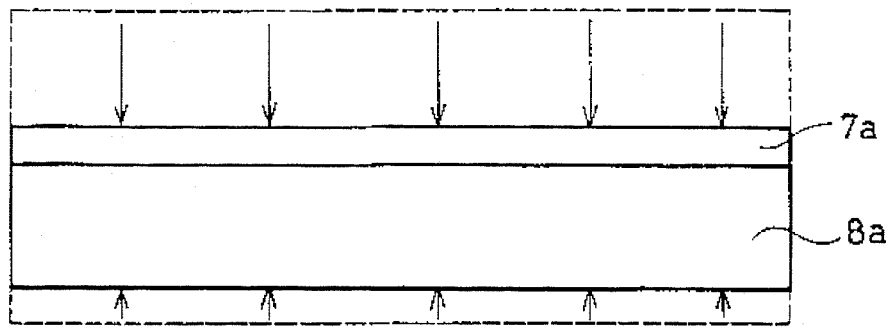

Referring to FIG. 4, first single crystalline silicon wafer 7 and second single crystalline silicon wafer 8 are ground to have desired thicknesses and then surfaces thereof are polished to form DZ layer 7a and IG layer 8a. Thereafter, it is placed into a manufacturing process of a semiconductor device.

It is not necessary for silicon wafer 1 formed in the above-mentioned manufacturing steps to undergo heat treatment at high temperature for diffusing oxygen outward for the formation of a DZ layer, which is required in a conventional IG method, since a wafer already having a low concentration of oxygen is used as DZ layer 7a. As a result, warping of wafer by heat stress or slip dislocation can be prevented. Also, formation of defects caused by secondary contamination in an annealing step or the like for heat treatment at high temperature can be prevented. Since a wafer already having a high concentration of oxygen is used as IG layer 8a, it is not necessary to carry out the heat treatment at low temperature for growth of nuclei for precipitating oxygen in the above-mentioned manufacturing steps, or, if necessary, a relatively short time period is required for growing the nuclei for precipitating oxygen in heat treatment. Thereafter, oxygen precipitates are formed in IG layer 8a in a heat treatment in a manufacturing process of a semiconductor device to produce a gettering effect.

As another example of the first embodiment, a wafer having a concentration of carbon of less than $1\times10^{15}$ atoms/$cm^3$ may be used as DZ layer 7a, and a wafer having a concentration of carbon of $1\times10^{15}$ atoms/$cm^3$ or more may be used as an IG layer.

A second embodiment will be described. Referring again to FIG. 1, in the second embodiment, both orientations of first single crystalline silicon layer 7a and the second single crystalline silicon layer 8a may be, for example, (111) or (110). These orientations may be different from each other. If these orientations differ, misfit of crystal is caused at the interface of first single crystalline silicon layer 7 and second single crystalline silicon layer 8a, thereby producing a gettering effect. Also, by making both orientations different from each other, slip caused in either of the silicon layers can be restrained from prevailing in the other silicon layer.

Figure 5:
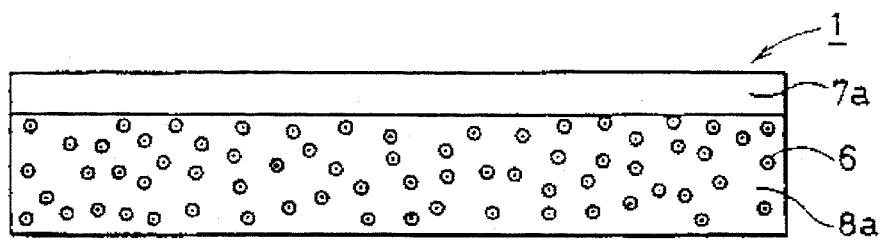
FIG. 5 is a sectional structural view of a semiconductor substrate according to a second embodiment of the present invention.
Figure 14:
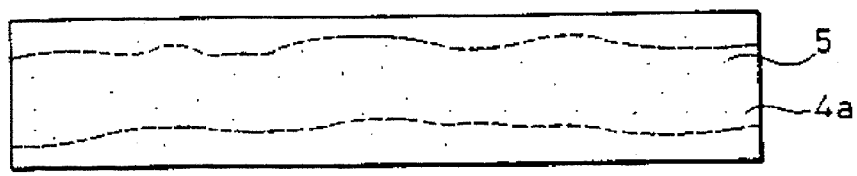
FIG. 14 is a sectional structural view showing the third step of the manufacturing steps of the semiconductor substrate shown in FIG. 11.
Figure 15:
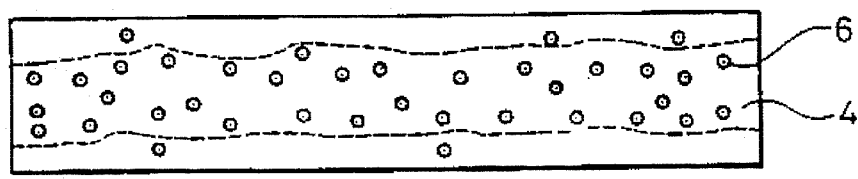
FIG. 15 is a sectional structural view showing the fourth step of the manufacturing steps of the semiconductor device shown in FIG. 11.

A third embodiment will be described. Referring to FIG. 5, as first single crystalline silicon layer 7a, a wafer manufactured by a CZ method is used in which oxygen originally contained has already diffused outward by heat treatment. Another wafer manufactured by a CZ method and a wafer manufactured by CZ method and subjected to heat treatment are joined, and thereafter, a portion in the wafer subjected to heat treatment where oxygen remains in high concentration is ground and removed. Consequently, one of two wafers manufactured by a CZ method can be used as DZ layer 7a and the other as IG layer 8a. As a variation of the first embodiment, a wafer manufactured by a CZ method to be used as an IG layer is subjected to heat treatment at low temperature beforehand to grow oxygen precipitates 6, and then it can be joined to a wafer manufactured by an MCZ method to form silicon wafer 1. If this method is used, heat treatment at low temperature of wafer by a CZ method can be carried out for about thirty minutes, which is shorter than the time for the heat treatment an low temperature carried out in the conventional step shown in FIG. 14, at a temperature of, for example, 650° C. to grow oxygen precipitates.

Figure 6:
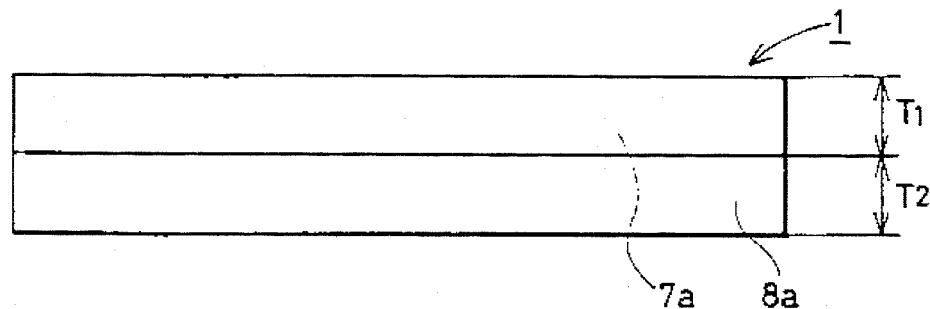
FIG. 6 is a sectional structural view of a semiconductor substrate according to a third embodiment of the present invention.

A fourth embodiment will be described. In the fourth embodiment shown in FIG. 6, a thickness $T_1$ of first single crystalline silicon layer 7a of a DZ layer may be the same as or more than a thickness $T_2$ of second single crystalline silicon layer 8a of an IG layer. When first single crystalline silicon layer 7a is formed thick, even if the layer is heat-treated at high temperature for a long time in a manufacturing process and oxygen is diffused from second single crystalline silicon layer 8a containing oxygen in high concentration from a first single crystalline silicon layer 7a in low concentration, a DZ region which is necessary for formation of elements can be secured.

Figure 7:
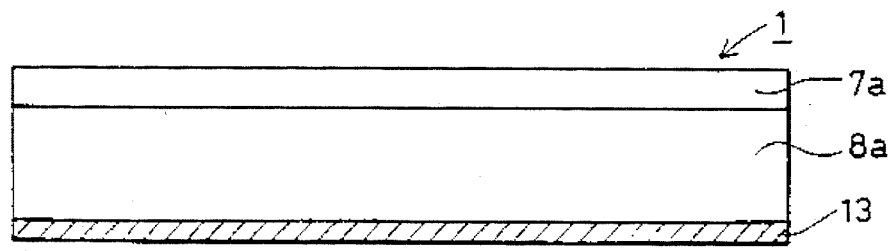
FIG. 7 is a sectional structural view of a semiconductor substrate according to a fourth embodiment of the present invention.

A fifth embodiment will be described. In a fifth embodiment shown in FIG. 7, an EG (Extrinsic Gettering) layer 13 is further provided with silicon wafer 1 in the first embodiment. As EG layer 13, a polycrystalline silicon layer, an amorphous silicon layer, a silicon nitride film or the like is used. The surface of second single crystalline silicon layer 8a may be sand-blasted to be rough. By providing EG layer 13, an extrinsic gettering effect can be produced by which harmful impurities or defects can be segregated in the back surface of second single crystalline silicon layer 8a and removed.

Figure 8:
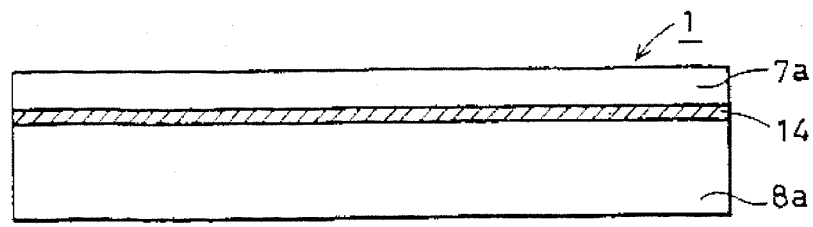
FIG. 8 is a sectional structural view of a semiconductor substrate according to a fifth embodiment of the present invention.

A sixth embodiment will be described. Referring to FIG. 8, an intermediate layer 14 is interposed between first single crystalline silicon layer 7a and second single crystalline silicon layer 8a in order to provide an improved gettering effect. For intermediate layer 14, polycrystalline silicon, amorphous silicon, or silicon nitride film is used. Intermediate layer 14 absorbs oxygen which is liable to diffuse from second single crystalline silicon layer 8a having a high concentration of oxygen to first single crystalline silicon layer 7a having a low concentration of oxygen and helps to maintain a concentration of oxygen of first single crystalline silicon layer 7a.

Figure 9:
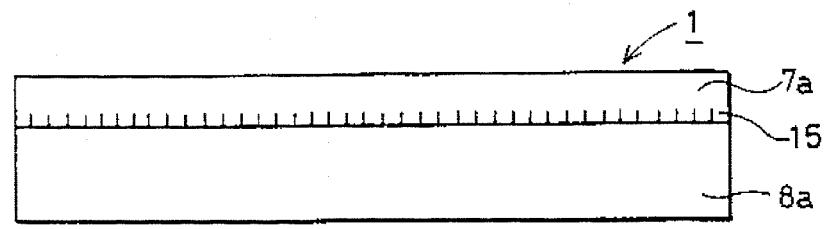
FIG. 9 is a sectional structural view of a semiconductors substrate according to a sixth embodiment of the present invention.

A seventh embodiment will be described. Referring to FIG. 9, a damage layer 15 is formed between first single crystalline silicon layer 7a and second single crystalline silicon 8a. As damage layer 15, a layer mechanically formed, a layer formed by ion implantation, or a layer formed by thermal diffusion of impurities, such as antimony, boron, and arsenic is used. Damage layer 15 improves a gettering effect.

Figure 10:
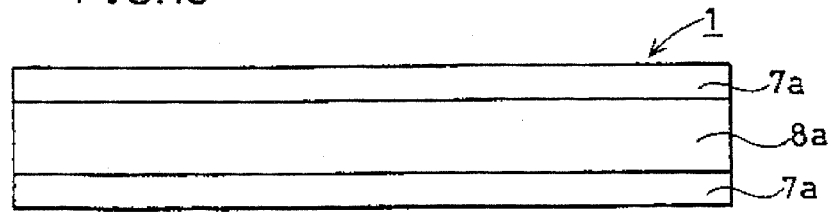
FIG. 10 is a sectional structural view of a semiconductor substrate according to a seventh embodiment of the preset invention.
Figure 11:
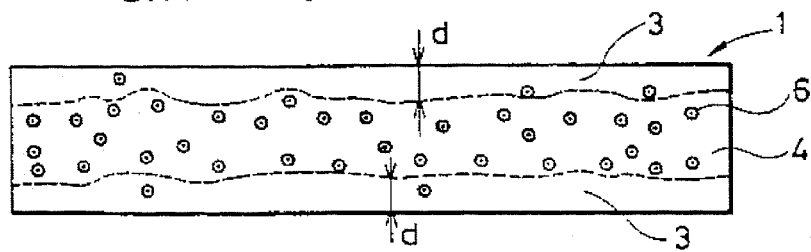
FIG. 11 is a sectional structural view of a semiconductor substrate manufactured by a conventional IG method.
Figure 12:
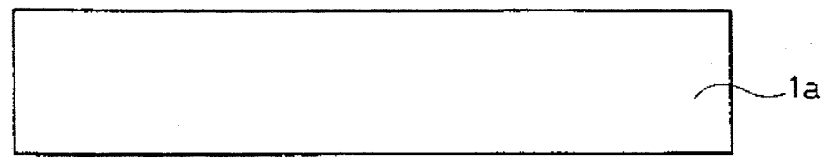
FIG. 12 is a sectional structural view showing the first step of the manufacturing steps of the semiconductor substrate shown in FIG. 11.
Figure 13:
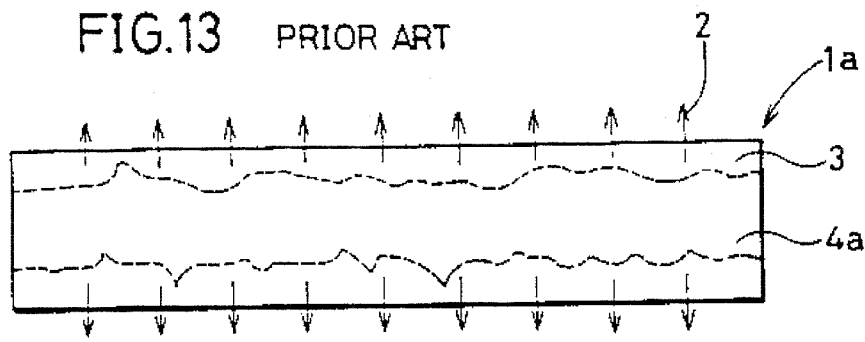
FIG. 13 is a sectional structural view showing the second step of the manufacturing steps of the semiconductor substrate shown in FIG. 11.

An eighth embodiment will be described. Referring to FIG. 10, second single crystalline silicon layer 8a is interposed between first single crystalline silicon layers 7a, 7a. For first single crystalline silicon layers 7a, 7a, two silicon wafers manufactured by, for example, an MCZ method are used and for second single crystalline silicon layer 8a, a silicon wafer manufactured by, for example, a CZ method is used. Silicon wafer 1 having such a slacked structure can symmetrize temperature distribution in heat treatment at high temperature and prevents warping of the wafer.

As described in the first embodiment, in order to form first single crystalline silicon layer 7a and second single crystalline silicon layer 8a to have prescribed thicknesses, a polishing process and mirror polishing process can be similarly applied to the other embodiments.

Thus, a semiconductor substrate according to the present invention has a first single crystalline silicon layer having a low concentration of oxygen suitable for a region for forming elements and a second single crystalline silicon layer having a high concentration of oxygen which is suitable for producing a gettering effect are joined to each other. These silicon layers are formed of different silicon wafers. Consequently, the optimal thickness for each layer in the semiconductor substrate can be easily secured and in the semiconductor substrate producing a gettering effect, fewer defects are formed in first single crystalline silicon layer, which results in excellent throughput.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor substrate, comprising:

a first single crystalline silicon layer having a main surface where a semiconductor element is formed and a junction surface on an opposite surface of said first single crystal silicon layer to the main surface, and having a first substantially uniform concentration of carbon throughout; and a second single crystalline silicon layer having a junction surface which is joined to said junction surface of said first single crystalline silicon layer so as to form a junction interface between said first and second single crystalline silicon layers, said second single crystalline layer having a second substantially uniform concentration of carbon throughout, which second substantially uniform centration of carbon is higher than said first substantially uniform concentration of carbon.

2. The semiconductor substrate according to claim 1, wherein said first uniform concentration of carbon of said first single crystalline silicon layer is less than $1 \times 10^{15}$ atoms/cm$^3$; and said second uniform concentration of carbon of said second single crystalline silicon layer is $1 \times 10^{15}$ atoms/cm$^3$ or more.

* * * * *